(12) United States Patent
Kohn

(10) Patent No.: US 9,629,245 B2
(45) Date of Patent: Apr. 18, 2017

(54) SOLDER SPACER AND ELECTRONIC MODULE COMPRISING SUCH A SPACER

(71) Applicant: SAGEMCOM BROADBAND SAS, Rueil Malmaison (FR)

(72) Inventor: Stephane Kohn, Rueil Malmaison (FR)

(73) Assignee: Sagemcom Broadband SAS, Rueil Malmaison (FR)

( * ) Notice: Subject to any disclaimer, the term of this patent is extended or adjusted under 35 U.S.C. 154(b) by 226 days.

(21) Appl. No.: 14/405,094

(22) PCT Filed: May 23, 2013

(86) PCT No.: PCT/EP2013/060676
§ 371 (c)(1),
(2) Date: Dec. 2, 2014

(87) PCT Pub. No.: WO2014/000999
PCT Pub. Date: Jan. 3, 2014

(65) Prior Publication Data
US 2015/0173192 A1    Jun. 18, 2015

(30) Foreign Application Priority Data

Jun. 27, 2012 (FR) .................... 12 56100

(51) Int. Cl.
*F16B 37/06* (2006.01)
*H05K 1/14* (2006.01)
*H05K 3/34* (2006.01)
*H05K 3/36* (2006.01)
*H05K 1/11* (2006.01)

(52) U.S. Cl.
CPC ............... *H05K 1/14* (2013.01); *H05K 1/11* (2013.01); *H05K 3/3447* (2013.01); *H05K 3/368* (2013.01); *H05K 2201/042* (2013.01); *H05K 2201/1081* (2013.01); *H05K 2201/10242* (2013.01); *H05K 2201/10409* (2013.01); *H05K 2201/10803* (2013.01); *H05K 2201/10818* (2013.01); *H05K 2201/10848* (2013.01); *H05K 2201/10871* (2013.01); *H05K 2201/2036* (2013.01)

(58) Field of Classification Search
CPC ....................................................... F16B 37/06
USPC .................................................... 411/171, 546
See application file for complete search history.

(56) References Cited

U.S. PATENT DOCUMENTS

| 4,950,244 A * | 8/1990 | Fellingham ....... A61M 5/16854 600/488 |
| 5,008,777 A | 4/1991 | Burns |
| 5,812,387 A * | 9/1998 | Lu ........................... H02M 3/00 361/790 |
| 5,932,065 A * | 8/1999 | Mitchell ............... H05K 3/3415 156/382 |

(Continued)

*Primary Examiner* — Roberta Delisle
(74) *Attorney, Agent, or Firm* — Muncy, Geissler, Olds & Lowe, P.C.

(57) ABSTRACT

The invention provides a spacer for soldering comprising an elongate body having one end provided with a tapped hole and an opposite end provided with a transverse bearing surface having a smooth centering peg projecting therefrom, the peg has a longitudinal outer passage extending over at least a fraction of its length as far as the transverse bearing surface to enable molten solder to penetrate by capillarity as far as the transverse bearing surface. The invention also provides a module including such a spacer.

5 Claims, 2 Drawing Sheets

(56) References Cited

U.S. PATENT DOCUMENTS

| | | | |
|---|---|---|---|
| 7,527,463 B2* | 5/2009 | Wang | F16B 37/048 |
| | | | 411/174 |
| 8,267,629 B2* | 9/2012 | Bang | F16M 11/00 |
| | | | 411/109 |
| 8,807,902 B2* | 8/2014 | Wang | F16B 37/061 |
| | | | 411/353 |
| 8,985,925 B2* | 3/2015 | Lan | F16B 33/004 |
| | | | 411/180 |
| 2006/0193714 A1* | 8/2006 | Werner | B23P 19/04 |
| | | | 411/546 |
| 2006/0228194 A1* | 10/2006 | Nilsen | F16B 4/004 |
| | | | 411/546 |
| 2009/0175015 A1 | 7/2009 | Mukouyama | |
| 2010/0122458 A1 | 5/2010 | Woods, Jr. et al. | |
| 2011/0083880 A1* | 4/2011 | Shingin | H05K 7/142 |
| | | | 174/250 |

* cited by examiner

SOLDER SPACER AND ELECTRONIC MODULE COMPRISING SUCH A SPACER

The invention relates to a spacer for soldering for use in assembling together two electronics cards or two plates of any kind. The invention also relates to electronics module including such a spacer.

BACKGROUND OF THE INVENTION

In electronics modules comprising a plurality of electronics cards, it is common practice to use spacers for assembling the electronics cards together. Such spacers are either made of plastics material, or else they are made of metal material, with metal spacers also serving to provide electrical continuity between the electrical grounds of electronics cards.

Certain spacers, also known as "standoffs", comprise an elongate body having one end that is tapped, defining a tapped hole, and a threaded segment extending from the other end of the elongate body.

FIG. 1 is a section view of a first electronics card 1 and a second electronics card 2 of an electronics module 3, the cards being assembled together by means of at least prior art spacer or standoff 4.

The body 5 of the spacer 4 is positioned between the cards 1 and 2 so that firstly the threaded segment 6 projects from the first card 1 through an optional washer 7 and an opening 8 formed in the first card 1, and secondly the tapped hole 9 is placed facing an opening 10 formed in the second card 2. A nut 11 is screwed onto the threaded segment 6, and a bolt 12 is screwed into the tapped hole 9 of the spacer 4 through the opening 10.

That assembly requires a large number of components to be used (a bolt, a nut, and a washer for each spacer), thereby increasing the cost of the electronics module and making it more complex to manage its bill of materials, obsolescence, supplies, etc.

To eliminate the nut and the washer, it might be envisaged that the spacer could be assembled by being fastened to the first card during a wave soldering operation consisting in applying solder directly to the thread of the spacer and over a reception area on the first card. A first drawback of fastening in that way is poor mechanical strength, due to the poor grip of solder on the thread, thereby limiting the tightening torque that can be applied to the bolt that penetrates into the tapping. A second drawback of such fastening is poor reproducibility in terms of the mechanical strength of the fastening, which means that is not possible to define a single tightening torque for all of the spacers, thereby making automatic assembly difficult to implement.

OBJECT OF THE INVENTION

An object of the invention is to propose a spacer enabling two electronics cards or plates of various kinds to be assembled together without presenting the above-mentioned drawbacks.

SUMMARY OF THE INVENTION

To achieve this object, the invention provides a spacer for soldering comprising an elongate body having one end provided with a tapped hole and an opposite end provided with a transverse bearing surface having a smooth centering peg projecting therefrom, the peg has a longitudinal outer passage extending over at least a fraction of its length as far as the transverse bearing surface so as to enable molten solder to penetrate by capillarity as far as the transverse bearing surface.

Thus, when assembling together two electronics cards or plates of various kinds, the spacer is fastened to the first card by a soldering operation performed via its centering peg. Such fastening therefore no longer requires the use of a washer and a nut. The longitudinal outer passage enables a certain quantity of solder to penetrate towards the support surface, thereby enabling a relatively large area of the spacer to be in contact with the solder. Fastening strength is proportional to the area in contact with the solder. The invention thus enables fastening to be performed effectively, thereby having the effects firstly of increasing the tightening torque that can be used on a bolt extending into the tapping of the body, and secondly improving the reproducibility of the mechanical strength of the fastening and thus enabling assembly to be performed automatically.

The invention also provides a module including such a spacer.

The invention can be better understood in the light of the following description of a particular, non-limiting embodiment of the invention.

BRIEF DESCRIPTION OF THE DRAWINGS

Reference is made to the accompanying drawings, in which.

DETAILED DESCRIPTION OF THE INVENTION

Figure 1:
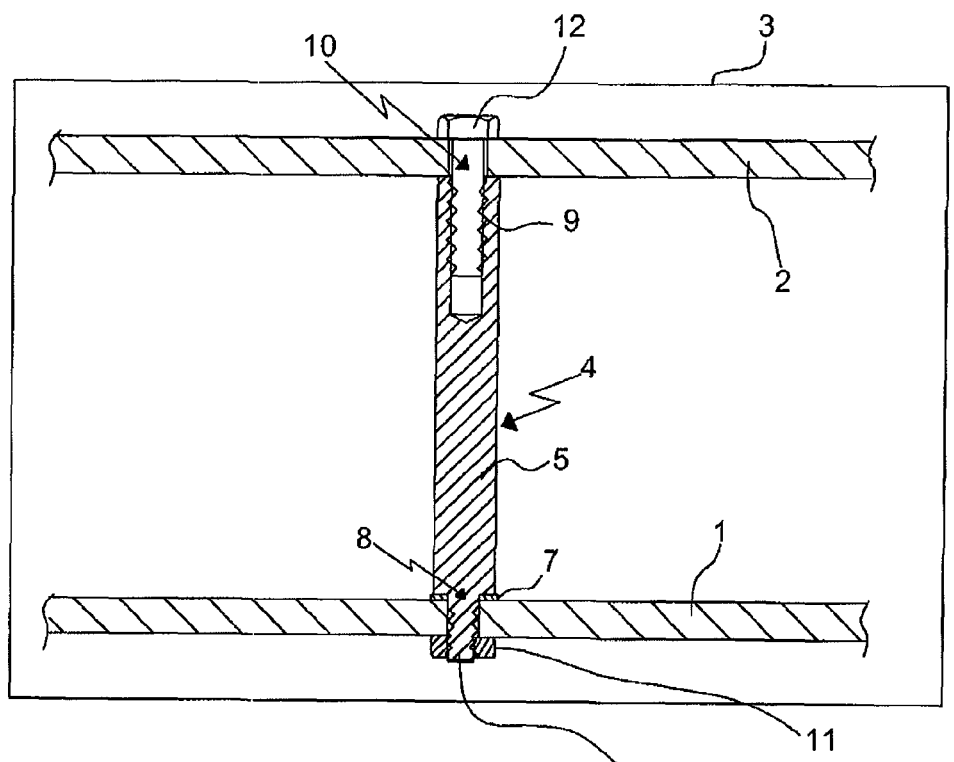
FIG. 1 is described above.
Figure 2:
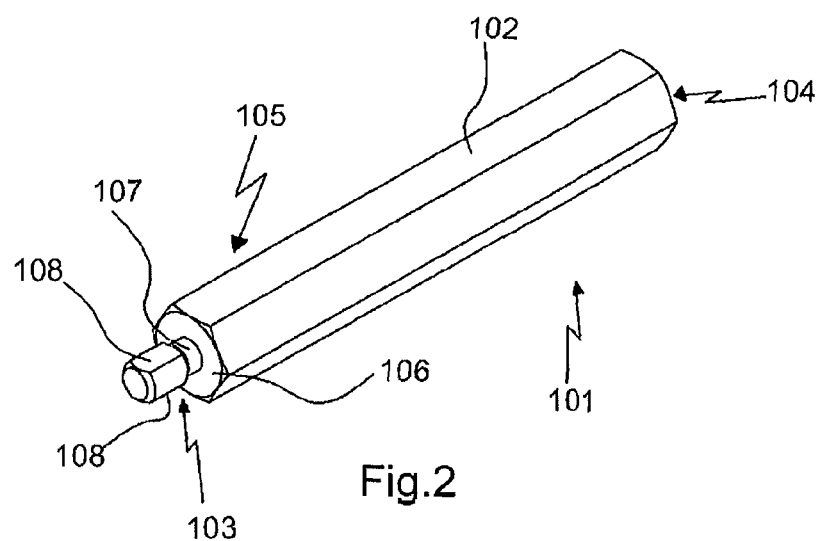
FIG. 2 is a perspective view of a spacer for soldering of the invention.

With reference to FIG. 2, a spacer for soldering 101 of the invention comprises an elongate body 102 of hexagonal cross-section and a centering peg 103 of generally cylindrical shape. The elongate body 102 has a tapped end 104 and an opposite end 105 provided with a transverse bearing surface 106 and having the centering peg 103 projecting therefrom along the axis of the elongate body 102. The centering peg 103 is connected to the transverse bearing surface 106 via a circular groove 107. The centering peg 103 is provided with two longitudinally-extending outer flats 108 that are arranged symmetrically.

Figure 3:
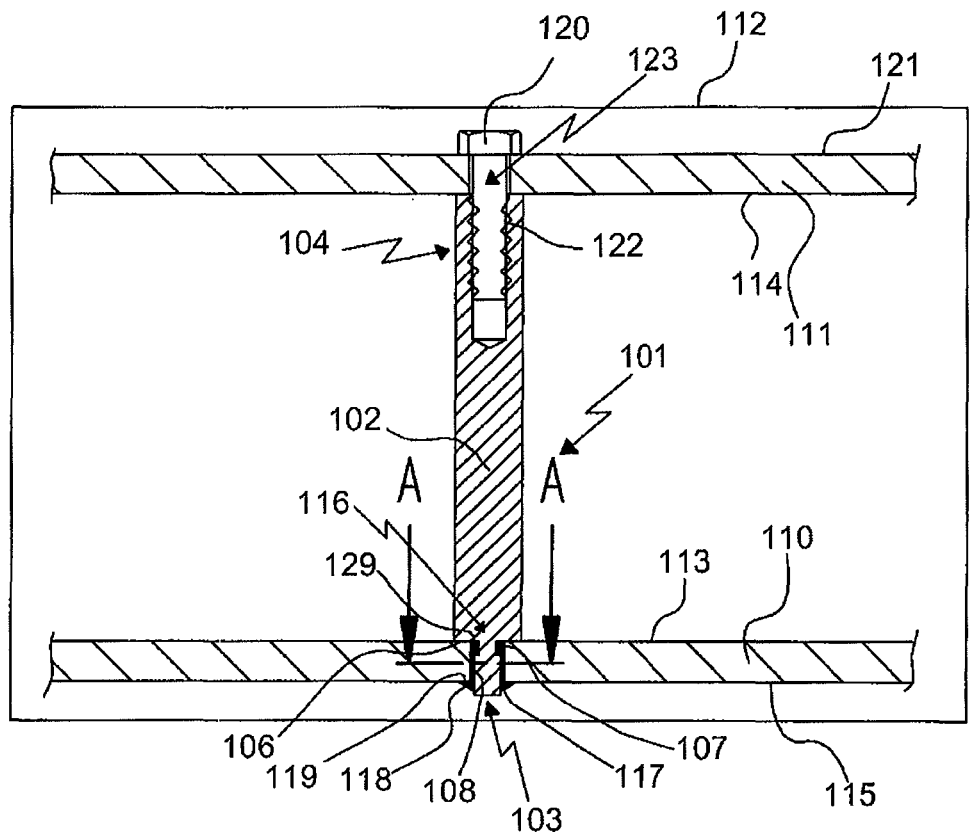
FIG. 3 is a section view of two electronics cards assembled together by means of a spacer for soldering of the invention.
Figure 4:
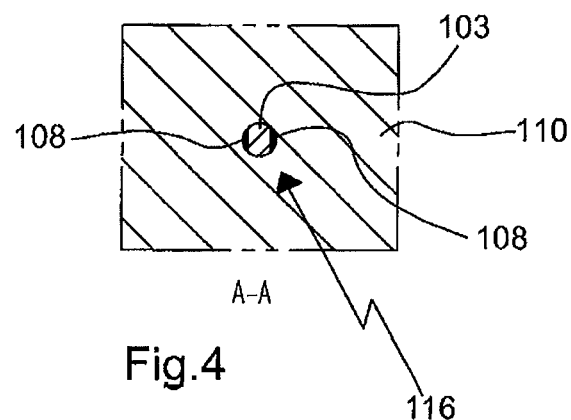
FIG. 4 is a section view of a centering peg of a spacer for soldering of the invention and of an electronics card, the section being taken on cross-section plane A-A in FIG. 3.

With reference to FIGS. 3 and 4, the spacer for soldering 101 of the invention is used in this example for assembling together a first electronics card 110 and a second electronics card 111 of an electronics module 112. The elongate body 102 of the spacer for soldering 101 is mounted between an inside face 113 of the first card 110 and an inside face 114 of the second card 111, and it serves to hold the two cards 110 and 111 spaced apart.

The spacer 101 is arranged on the first card 110 so that the transverse bearing surface 106 bears against the inside face 113 of the first card 110, and so that the centering peg 103 projects beyond an outside face 115 of the first card 110 through an opening 116 formed in the first card 110.

The fastening serving to secure the spacer 101 together with the first card 110 is performed by any soldering method (reflow soldering in an oven, wave soldering, manual soldering, etc.). The solder is applied to a free end 117 of the peg 103. The molten solder (which may for example contain a certain proportion of tin) penetrates by capillarity towards the groove 107 in the spacer 101, passing via a space situated in the opening 116 and defined by the flat 108. A first quantity of molten solder 118 spreads over a reception area 119 surrounding the opening 116 in the first card over the outside face 115 of the first card 110. A second quantity of molten solder 129 fills the groove 107 in the spacer 101 up to the transverse bearing surface 106. The groove 107 enables solder to be applied uniformly over the transverse bearing surface 106, thereby forming a fastener that presents strong and reproducible mechanical strength in all similar spacers fitted to any electronics module.

The fastening whereby the spacer and the second card 111 are secured to each other is performed by screwing a bolt 120 from an outside face 121 of the second card 111 into the tapped hole 122 in the tapped end 104 of the spacer 101 through an opening 123 formed in the second card 111. The opening 116 formed in the first card 110 and the opening 123 formed in the second card 111 are positioned to be in register with each other.

The centering peg 102 enables the spacer 101 to be centered in the opening 116 of the first card 110 so as to ensure assembly tolerance that is sufficient to enable the bolt 120 to be screwed easily into the tapping 122.

The robustness and the reproducibility of the fastening to the first card 110 enables considerable tightening torque to be applied to the bolt 120 in the tapped hole 122 beside the second card 111, and makes it possible to define identical tightening torque for any bolt associated with such a spacer, thereby making it easier to automate such assembly, as described above.

The invention is not limited to the particular embodiment described above, but on the contrary covers any variant coming within the ambit of the invention as defined by the claims.

Although the centering peg is provided with flats that are symmetrical, it is possible to provide a different outer longitudinal passage, e.g. comprising one or more grooves arranged in such a manner that the centering peg can continue to ensure a centering function for the spacer relative to the card.

The body may have a cross-section other than hexagonal, such as a cross-section that is polygonal, square, cylindrical, etc.

Although the invention is illustrated by using a spacer for soldering of the invention to assemble together two electronics cards in an electronics module, it is possible to use such a spacer for assembling together any type of element having a plane portion that it is desired to hold spaced apart from another plane portion.

The invention claimed is:

1. A spacer for soldering comprising an elongate body having one end provided with a tapped hole and an opposite end provided with a transverse bearing surface having a smooth centering peg projecting therefrom, the peg has a longitudinal outer passage extending over at least a fraction of its length as far as the transverse bearing surface to enable molten solder to penetrate by capillarity as far as the transverse bearing surface.

2. The spacer for soldering according to claim 1, wherein the peg is connected to the transverse bearing surface via a circular groove.

3. The spacer for soldering according to claim 1, wherein the outer passage includes at least one flat.

4. The spacer for soldering according to claim 1, wherein the outer passage has two symmetrical flats.

5. An electronics module having two electronics cards that are held spaced apart by a spacer according to claim 1, wherein the spacer is fastened to one electronics card by co-operation between a bolt and the end provided with a tapped hole, and the spacer is fastened to the other card via solder connecting the peg to the card and penetrating along the peg via the longitudinal outer passage to the transverse bearing surface.

* * * * *